United States Patent [19]

Dannenberg

[11] Patent Number: 6,112,138
[45] Date of Patent: Aug. 29, 2000

[54] PROGRAMMING RESPONSE OF ELECTRONICALLY-CONTROLLED GAUGES

[75] Inventor: Robert D. Dannenberg, Auburn, Ind.

[73] Assignee: Navistar International Transportation Corp, Chicago, Ill.

[21] Appl. No.: 08/421,016

[22] Filed: Apr. 12, 1995

Related U.S. Application Data

[63] Continuation of application No. 08/130,038, Sep. 30, 1993, abandoned.

[51] Int. Cl.[7] .................................................. G06F 17/00
[52] U.S. Cl. ......................... 701/1; 324/114; 340/870.16
[58] Field of Search ........................ 364/424.01, 424.05, 364/550, 556, 565, 572, 581; 324/114, 115; 340/870.13, 870.16; 341/144, 151

[56] References Cited

U.S. PATENT DOCUMENTS

| | | | |
|---|---|---|---|
| 4,838,082 | 6/1989 | McCoy et al. | 73/313 |
| 4,862,365 | 8/1989 | Onesti | 364/424.01 |
| 4,875,041 | 10/1989 | Dannenberg | 340/870.13 |
| 4,939,675 | 7/1990 | Luitje | 364/550 |
| 4,991,098 | 2/1991 | Dantzler | 364/424.01 |
| 5,027,656 | 7/1991 | Garrison | 73/313 |
| 5,150,683 | 9/1992 | Depa et al. | 123/417 |
| 5,257,300 | 10/1993 | Bennett et al. | 377/21 |

OTHER PUBLICATIONS

Computer Dictionary, second edition, Microsoft Press, Redmond, Washington, 1994, pp. 141–142.

*Primary Examiner*—William A. Cuchlinski, Jr.
*Attorney, Agent, or Firm*—Jeffrey P. Calfa; Dennis Kelly Sullivan

[57] ABSTRACT

Rather than using the viscosity of dampening oil to establish the speed at which the movement of an air core instrument gauge moves, the speed is defined by programming speed data into memory of a microprocessor that controls the movement. When the microprocessor receives an input signal commanding the movement to move, it develops an output signal for operating the movement that is based both on the input signal and on the stored speed signal. The stored speed signal is used by the microprocessor as weight for a software filter used in development of the output signal.

8 Claims, 3 Drawing Sheets

PROGRAMMING RESPONSE OF ELECTRONICALLY-CONTROLLED GAUGES

This is a continuation of application Ser. No. 08/130,038 filed on Sep. 30, 1993 and now abandoned.

FIELD OF THE INVENTION

This invention relates generally to instrument gauges, such as those used in instrument clusters of automotive vehicles for providing information to the driver about various parameters concerning the vehicle's operation.

BACKGROUND AND SUMMARY OF THE INVENTION

Historically, instrument gauges used in the instrument clusters of cars and trucks have been designed for a single mode of operation. For example, a tachometer that displays engine speed is designed to provide a very fast gauge pointer response for closely following changes in engine speed. On the other hand, a fuel gauge that displays the level of fuel in the fuel tank is designed to provide a very slow gauge pointer response so that the driver does not see the results of fuel slosh when the vehicle accelerates, decelerates, or makes a turn. This historical approach has been proven over time to appear very satisfactory from the view point of the driver; however, when all factors bearing on the total information conveying system are concerned, it is believed that certain beneficial improvements can be made that will assure continued driver satisfaction while offering new economies and versatilities in the manufacture, fabrication, and servicing of instrument gauge systems, particularly systems that employ instrument gauges having electromechanical movements, like air core gauges, and that also employ modern electronics that interface the gauges to the various signal sources, like speed sensors, pressure sensors, levels sensors, communication data links, etc.

Although air core gauges have enjoyed wide usage for many, many years, they continue to enjoy significant usage in the age of electronics because they provide certain advantages that newer electronic readouts have not yet been able to achieve. Perhaps, most significant of these advantages are cost, durability, and ease of reading.

An air core gauge can be fabricated in a cost-effective manner. Once an air core gauge has been installed and found to be operating properly, it should provide reliable service for the life of the vehicle in normal circumstances. Because an air core gauge uses a pointer to indicate its reading, the driver can quickly see if a reading is normal or abnormal.

An electronic gauge that comprises a digital readout is generally more costly, and the value of the parameter which it displays may require interpretation by the driver in order to determine if the reading is normal or abnormal. While the latter attribute of a digital electronic readout may not always be true in the case of a digital speedometer, a digital tachometer, or a digital fuel level gauge, it is often true in the case of other readouts.

In a known instrumentation system in which electromechanical gauges interface with their signal sources via microprocessor-based electronics, a common procedure in finalizing a functional system comprises programming the signal source, the calibration data, and the mode of operation for each gauge by means of an electronic programming tool.

Insofar as the applicant is aware, it has heretofore not been proposed to utilize the programming tool to also program into the electronics a desired response characteristic that defines how fast or slowly the electromechanical gauge movement is to respond to a given change in the signal from the associated signal source.

The present invention relates to an improvement whereby the programming tool is utilized to also program such a desired response characteristic into the electronics for each gauge. This improvement can provide important benefits in the manufacture, fabrication, and servicing of instrumentation systems having gauges with electromechanical movements.

One advantage of the invention is that there can be a greater commonality of gauges because the response speed of the movement of a particular gauge is established by programmed data, and not by the particular physical construction of the gauge. Heretofore, a common practice for establishing the speed of response of a gauge has been to choose a particular viscosity for a dampening fluid, i.e. a dampening oil, introduced into the gauge during the process of making it. Thus, a gauge for a particular application was heretofore often unique to that application because of the particular response speed best suited for the operating parameter being displayed on the gauge. This meant that in a typical instrument cluster, a number of unique gauges would be required. For example, because a gauge that is suited for tachometer use requiring fast response would be inherently poorly suited for fuel gauge use requiring slow response, and vice versa, unique gauges would be required for each.

With the present invention, such diverse uses can nevertheless employ common gauges in an instrument cluster, since the speed at which the gauge is to respond (i.e. gauge speed response) is, in each instance, programmed into the electronics by the electronic programming tool contemporaneously with programming of the associated signal source (i.e. sensor or data link) and the requisite calibration (i.e. matching the span of the gauge movement to the range of the signal from the source) for the gauge being programmed.

By thus increasing the commonality of gauge usage, fewer unique gauges are required, and this offers the potential for economies of scale, since a larger number of common gauges can be produced, and the number of unique gauges can be reduced. This simplifies inventory and parts requirements as well.

The ability to electronically program the gauge response offers still further advantages. If a vehicle operator wishes a given gauge to have a different response speed, i.e. if the response is deemed either too fast or too slow, the electronics need only be re-programmed by the programming tool with a different response speed. Thus, any particular gauge can be expeditiously customized for an operator either before or after the operator takes delivery of the vehicle.

Testing of an instrument cluster can also be more quickly accomplished with the present invention. For example, the movement of a fuel gauge which typically has a slow response speed can be tested as if it had a fast response speed either by by-passing the programmed slow speed response at time of testing or by temporarily substituting a fast speed response for the slower one during the test.

Implementation of the invention may be considered as programming a particular "weight" of a software filter that is configured in the microprocessor-based electronics as part of the processing of a raw data signal by which the raw signal is converted to a form suitable for output to a gauge drive circuit that drives the corresponding gauge movement. Such "weighted" software filtering is independent of any signal calibration that is required to be performed by the microprocessor-based electronics to match the span of the signal to the span of the gauge. Thus, although a preferred implementation of the invention may possess software aspects, the invention is physically embodied in hardware, albeit hardware that has been programmed from an external source.

The foregoing features, advantages, and benefits of the invention, along with additional ones, can be seen in the following detailed description of the invention which includes the best mode contemplated at this time for carrying out the invention. Drawings accompany the disclosure and are briefly described as follows.

DESCRIPTION OF THE PREFERRED EMBODIMENT

Figure 1:
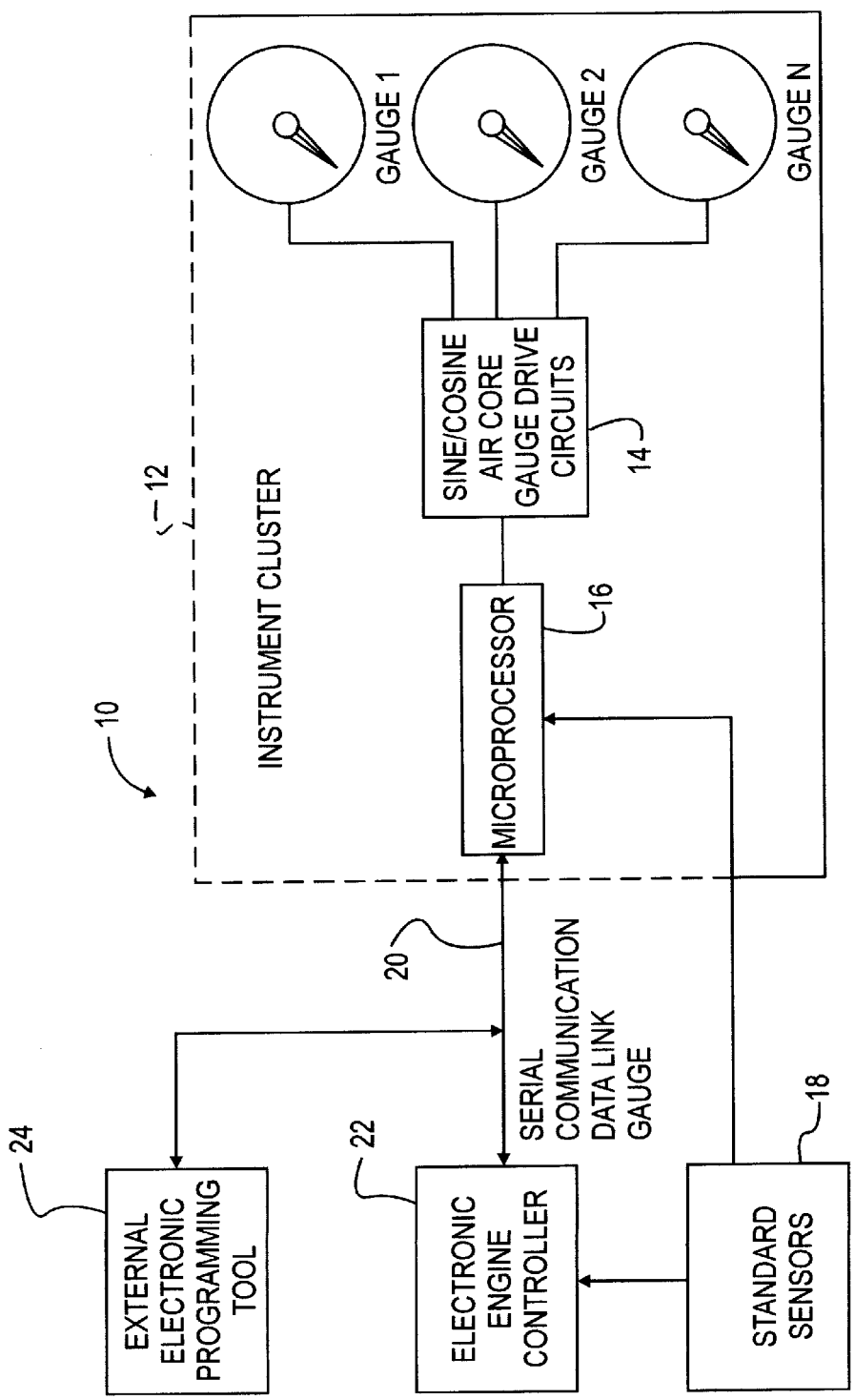
FIG. 1 is a block diagram of an instrument system which includes a cluster, signal sources, and microprocessor-based electronics that interfaces the signal sources with the gauges in the cluster.

In FIG. 1 a representative instrument system 10 for an automotive vehicle such as a heavy truck comprises: an instrument cluster 12 containing a number of instrument gauges, G1, G2, . . . GN, gauge drive circuits 14, and a microprocessor 16. Signal sources for instrument cluster 12 are various standard sensors 18, and data that is published from time to time on a standard serial communication data link 20. The roots of data published on data link 20 may be virtually anywhere, but typically are sensors associated primarily with a major vehicle component such as an electronic engine controller 22, in which case, the sensor data is published on the data link in standard communication format after having been obtained via controller 22. This much of instrument system 10 represents known configurations which are in accordance with an industry standard specification, SAE J1708/J1587.

Such standard configurations are also programmed with certain data by means of an electronic programming tool 24. Programming tool 24 is a service device external to system 10, and is plugged into the system at time of original programming, or later on, if re-programming is to be performed. It is unplugged and removed after performing the programming or re-programming. The known programming tool programs memory of microprocessor 16 with signal source and calibration data for each gauge, G1, G2, . . . GN.

In the functional system 10, each gauge pointer P1, P2, . . . PN is driven to an angular deflection by microprocessor 16 acting through a corresponding one of gauge drive circuits 14. The signal input to microprocessor 16 from each source is matched to and calibrated for the corresponding gauge by the microprocessor in accordance with the signal source and calibration data that has been programmed into non-volatile memory of the microprocessor by the programming tool. In this way, each pointer is driven to an angular deflection that represents the value of the corresponding signal input.

In the known systems, the response speed of a gauge movement is established by the physical construction of the gauge itself. Typically, a gauge is constructed for fast response, but if fast response is not desired, motion of the movement may be dampened by the particular viscosity of dampening fluid introduced into the gauge. Therefore, in the known systems, there may be a number of gauges that while outwardly appearing identical, are in actuality different because they contain different viscosities of dampening fluid or no such fluid at all.

According to principles of the present invention, the dampening of the motion of the gauge movement is accomplished, not by the particular viscosity of a dampening fluid in the gauge, but rather by programming a desired response speed for each gauge into microprocessor 16 by means of programming tool 24 contemporaneously with the programming of any signal source and calibration data for the gauge.

In the known systems, raw data from standard sensors or data links is not always filtered or averaged to a level that is appropriate to directly operate the gauges. It has therefore been conventional practice to send all incoming data from any signal source through a software filter to "average" the data so that a smooth sweep of the gauge pointer occurs as the value of the signal changes. But, in these known systems, the sweep speed is established by the mechanical dampening that is built into the individual gauge, even though the "averaging" of the raw data might be considered by some individuals as a form of dampening. The dampening that is the focus of the present invention is the dampening of the motion of the gauge movement that occurs independently of any "averaging" of the raw signal data to create a commanded position for the gauge pointer. The novel dampening of the present invention defines the speed at which the gauge pointer moves in response to a change in input signal calling for a change in pointer position.

Figure 2:
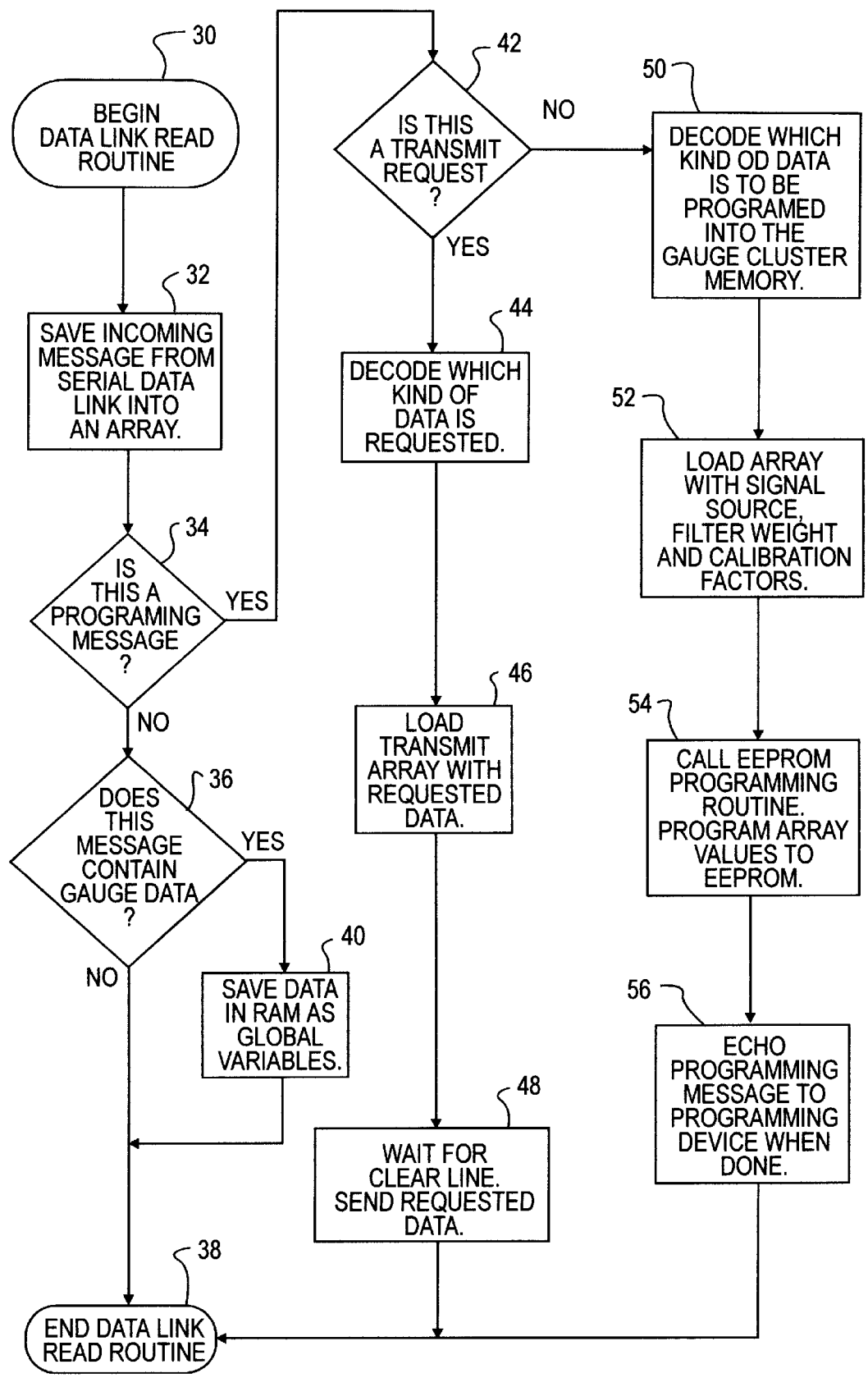
FIG. 2 is a flow diagram for a data link read routine that is executed during operation of the system of FIG. 1.
Figure 3:
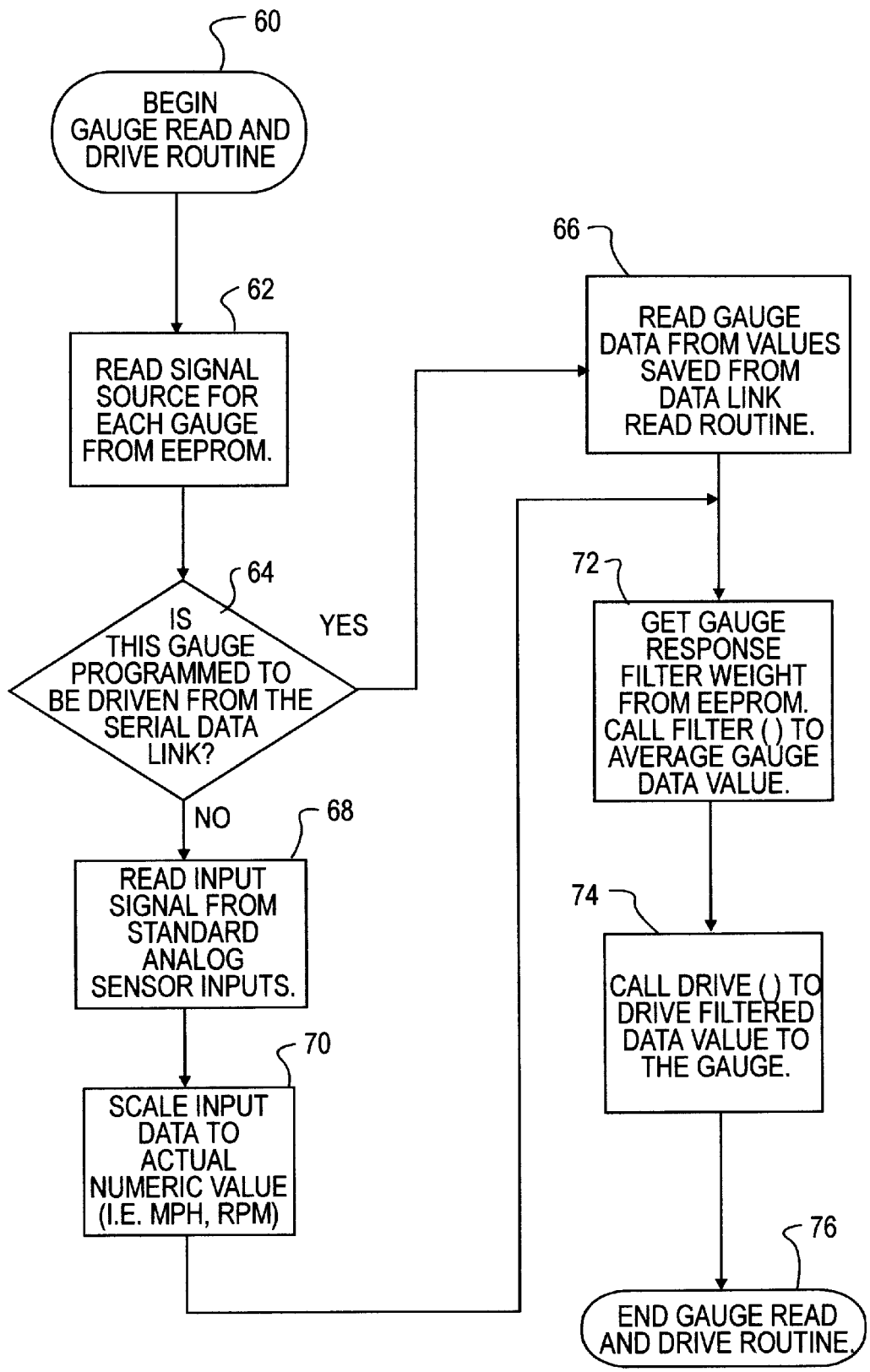
FIG. 3 is a flow diagram for a gauge read and drive routine that is executed during operation of the system of FIG. 1.

With the foregoing in mind, the reader's attention is directed to FIGS. 2 and 3 which show programming routines that are implemented in microprocessor 16 of system 10 for the purpose of providing not only the known programming system described above, but also the "weighting" of a software filter that establishes the speed at which the gauge pointer moves in response to change in input signal, in accordance with the present invention.

FIG. 2 shows a data link read routine that is executed from time to time by microprocessor 16 to read data published on data link 20. The numeral 30 represents the beginning of the routine, and the first step is represented by the numeral 32. This step comprises saving the published message in an array of the microprocessor. The next step 34 is a decision step for deciding if the saved message is a programming message. If it is not, the next step 36 is a decision step for deciding if the saved message contains data. If it does not, the routine ends, as represented by block 38; but if it does, then the data is saved in ram (random access memory) of the microprocessor, as represented by step 40, before the routine ends. In this way, signal source data is repeatedly updated in memory of the microprocessor.

On the other hand, if the decision step 34 decides that the message is a programming message, meaning a message from programming tool 24, then the routine executes a series of steps either for loading the programming data into the microprocessor, or for reading programmed data already stored in the microprocessor. Thus, if step 34 answers "yes", then the first ensuing step 42 decides if the message is a transmit request, and if step 42 answers "yes", then steps 44, 46, and 48 are executed before the routine ends. Step 44 determines what data is being requested. Step 46 loads the data designated by step 44 into a transmit array of the microprocessor. And step 48 causes that data to be transmitted onto the data link when clear. In this way, it is possible for a person using the programming tool to ascertain what particular programmed data has already been loaded into the microprocessor memory for the gauges.

If decision step 42 determines that the message is not a transmit request, then the message is understood to be a programming message, and steps 50, 52, 54, and 56 are executed before the routine ends. Step 50 determines the type or types, of data contained in the message, namely signal source data, filter weight data, and calibration data. It is the inclusion of the filter weight data that enables the benefits of the present invention to be realized. Step 52 comprises loading an internal array of the microprocessor with the data. Step 54 comprises calling a routine identified as "EEprom Programming Routine" that causes the data in the array to be loaded into non-volatile memory (EEprom). Step 56 confirms the loading to the programming tool after completion.

The gauge read and drive routine of FIG. 3 is repeatedly executed during operation of the vehicle to operate instrument system 10. The execution of the routine utilizes the data that has been programmed into memory, as described above, for processing incoming signals so that they will properly operate the various individual gauges G1, G2, . . . GN. The beginning of the gauge read and drive routine is designated by the numeral 60. The first step is to determine the appropriate signal source for each gauge, and this step is designated 62. This signal source information has been stored in non-volatile memory (EEprom) of the microprocessor, as explained earlier (steps 52 and 54 of FIG. 2). The next step 64 is a decision step for each gauge, deciding if it has been programmed to utilize data from data link 20. If the answer is "yes", then step 66 is performed to read the data that was stored by step 40 of the data link read routine of FIG. 2. On the other hand, if the decision of step 64 is "no" for any gauge, then the data for the gauge is read (step 68) by microprocessor 16 from the corresponding standard sensor 18 (FIG. 1). Where the standard sensor is an analog device, appropriate signal scaling can be accomplished by a scaling step 70.

From both sensors and data link, signal data is then processed by a step designated 72 in FIG. 3. This step reads the "weight" that has been programmed for the software filter so that the desired speed at which the gauge pointer moves will occur. Once this "weight" has been read for a gauge, it is utilized in a sub-routine called "Filter( )" to produce an appropriate signal for driving the gauge. The final step 74 is the execution of a sub-routine called "Drive( )" which enables the gauge drive circuits 14 to drive the gauges. The gauge read and drive routine ends at 76.

The invention can be implemented in known microprocessor-based electronic instrument clusters by means of conventional programming techniques on the basis of the foregoing disclosures. While a presently preferred embodiment of the invention has been illustrated and described, it should be appreciated that the inventive principles can be applied to other embodiments falling within the scope of the following claims.

What is claimed is:

1. In a microprocessor-based instrument gauge comprising:
  B) a microprocessor comprising,
    i) input means for receiving data,
    ii) memory means for storing data,
    iii) processing means for processing data,
    iv) and output means for delivering processed data;
  C) means supplying gauge programming data to said input means and means supplying gauge signal data to said input means;
  D) said memory means storing gauge programming data that is used by said processing means to create gauge movement data at said output means;
  E) gauge movement drive circuit means operatively coupling said output means with said gauge movement for causing said gauge movement to be operated by said gauge movement data;
  F) said microprocessor being configured to store as gauge programming data, one or more various parameters relevant to operation of the gauge movement;
the improvement which comprises:
  G) said means supplying gauge programming data to said input means comprising means supplying to said input means movement speed data defining speed at which the gauge movement is to move when the microprocessor acts on gauge signal data commanding a change in the position of the gauge movement;
  H) said microprocessor memory means comprising an EEprom that is programmed from said means supplying gauge programming data for erasably storing as one of said various parameters, the movement speed data supplied to said input means; and
  I) said processing means acting on the movement speed data stored in said EEprom of said memory means to create gauge movement data at said output means for causing the gauge movement to move at speed determined by the stored movement speed data when said processing means acts on gauge signal data commanding a change in position of the gauge movement.

2. The improvement set forth in claim 1 in which said microprocessor comprises a software filter through which gauge signal data is passed before reaching said gauge movement drive circuit means and said processing means acts to apply the movement speed data stored in said memory means as a weight to said software filter so that the filtered gauge signal data is weighted by the movement speed data stored in said EEprom of said memory means before being allowed to act on the gauge movement.

3. The improvement set forth in claim 1 in which said movement of said instrument gauge comprises an air core movement.

4. In a microprocessor-based instrument cluster comprising:
  A) a plurality of instrument gauges having like movements, each with the same mechanical speed response to inputs;
  B) a microprocessor serving all such gauges and comprising,
    i) input means for receiving data,
    ii) memory means for storing data,
    iii) processing means for processing data,
    iv) and output means for delivering data;
  C) means supplying to said input means gauge programming data and means supplying gauge signal data to said input means;
  D) said memory means storing gauge programming data that is used by said processing means to create gauge movement data at said output means;
  E) gauge movement drive circuit means operatively coupling said output means with the movements of said gauges for causing said movements to be operated by gauge movement data;
  F) said microprocessor being configured to store as gauge programming data, one or more various parameters relevant to operation of each gauge movement;

the improvement which comprises:
- G) means supplying gauge programming data to said input means comprising means supplying to said input means movement speed data defining speed at which each gauge movement is to move when the microprocessor acts on gauge signal data for it commanding a change in its position;
- H) said microprocessor memory means comprising an EEprom that is programmed from said means supplying gauge programming data for erasably storing as one of said various parameters for each gauge movement, the movement speed data supplied to said input means for that gauge movement; and
- I) said processing means acting on the movement speed data stored in said EEprom of said memory means for each gauge to create for that gauge, gauge movement data at said output means for causing that gauge movement to move at speed determined by the movement speed data stored for it in said memory means when said processing means acts on gauge signal data for that gauge commanding a change in position of the gauge's movement.

5. The improvement set forth in claim 4 in which said movements of said instrument gauges comprise air core movements.

6. The improvement set forth in claim 4 in which said microprocessor comprises software filter means through which gauge signal data for said gauges is passed before reaching said gauge movement drive circuit means, and said processing means acts to apply the movement speed data stored in said EEprom of said memory means for each gauge as a corresponding weight to said software filter means so that the filtered gauge signal data for each gauge is weighted by the corresponding speed data stored in said memory means.

7. In a method of operating an electromechanical movement of an instrument gauge by means of a microprocessor, the improvement which comprises:
- A) programming, from an external programming device, an EEprom of memory of said microprocessor with speed data defining speed at which the movement is to move and;
- B) causing said microprocessor to create both from an input signal representing a position to which the movement is to move and from the speed data programmed from the external programming device into said EEprom of said memory, an output signal for causing the movement to move to said position at speed determined by the speed data in said EEprom of said memory.

8. The improvement set forth in claim 7 further comprising, applying the speed data in said EEprom of said memory as weight for a software filter of said microprocessor that is used in development of said output signal.

* * * * *